(12) United States Patent
Liu et al.

(10) Patent No.: US 11,742,564 B2
(45) Date of Patent: Aug. 29, 2023

(54) FAN-OUT PACKAGE STRUCTURE WITH INTEGRATED ANTENNA

(71) Applicant: MediaTek Inc., Hsin-Chu (TW)

(72) Inventors: Nai-Wei Liu, Hsin-Chu (TW); Yen-Yao Chi, Hsin-Chu (TW); Tzu-Hung Lin, Hsin-Chu (TW); Wen-Sung Hsu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 163 days.

(21) Appl. No.: 17/321,914

(22) Filed: May 17, 2021

(65) Prior Publication Data

US 2021/0273317 A1 Sep. 2, 2021

Related U.S. Application Data

(62) Division of application No. 16/387,354, filed on Apr. 17, 2019, now Pat. No. 11,043,730.

(Continued)

(51) Int. Cl.
*H01Q 1/22* (2006.01)
*H01L 23/31* (2006.01)
(Continued)

(52) U.S. Cl.
CPC ....... *H01Q 1/2283* (2013.01); *H01L 23/3128* (2013.01); *H01L 23/3135* (2013.01);
(Continued)

(58) Field of Classification Search
CPC ............ H01L 23/66; H01L 2223/6677; H01Q 1/2286; H01Q 9/0407; H01Q 9/0414
See application file for complete search history.

(56) References Cited

U.S. PATENT DOCUMENTS 8,120,539 B2 2/2012 Hong et al.
8,407,890 B2 4/2013 Tang
(Continued)

FOREIGN PATENT DOCUMENTS

CN 1298204 A 6/2001
CN 101213663 A 7/2008
(Continued)

OTHER PUBLICATIONS

Extended European Search Report dated Oct. 21, 2019 in connection with European Application No. 19173046.4.
(Continued)

*Primary Examiner* — David A Zarneke
(74) *Attorney, Agent, or Firm* — Wolf, Greenfield & Sacks, P.C.

(57) ABSTRACT

A semiconductor package structure is provided. The semiconductor package structure includes a semiconductor die surrounded by a first molding compound layer. A redistribution layer (RDL) structure is formed on a non-active surface of the semiconductor die and the first molding compound layer. A second molding compound layer is formed on the RDL structure. An insulating capping layer covers the second molding compound layer. An antenna is electrically coupled to the semiconductor die and includes a first antenna element formed in the RDL structure and a second antenna element formed between the second molding compound layer and the insulating capping layer.

5 Claims, 6 Drawing Sheets

Related U.S. Application Data (60) Provisional application No. 62/670,920, filed on May 14, 2018.

(51) Int. Cl.
  H01L 23/538 (2006.01)
  H01L 23/66 (2006.01)
  H01L 23/00 (2006.01)
  H01Q 1/38 (2006.01)
  H01Q 9/16 (2006.01)

(52) U.S. Cl.
  CPC ...... H01L 23/5384 (2013.01); H01L 23/5386 (2013.01); H01L 23/5389 (2013.01); H01L 23/66 (2013.01); H01L 24/20 (2013.01); H01Q 1/38 (2013.01); H01Q 9/16 (2013.01); *H01L 2223/6677* (2013.01); *H01L 2224/211* (2013.01); *H01L 2224/221* (2013.01)

(56) References Cited

U.S. PATENT DOCUMENTS

| | | | |
|---|---|---|---|
| 8,816,906 | B2 | 8/2014 | Kamgaing et al. |
| 8,866,292 | B2 | 10/2014 | Beer et al. |
| 8,890,284 | B2 | 11/2014 | Kilger et al. |
| 8,952,521 | B2 | 2/2015 | Wojnowski et al. |
| 9,007,273 | B2 | 4/2015 | Liao et al. |
| 9,088,072 | B2 | 7/2015 | Takaki et al. |
| 9,935,065 | B1 | 4/2018 | Baheti et al. |
| 9,953,936 | B2 | 4/2018 | Chen et al. |
| 10,096,558 | B1 * | 10/2018 | Chiang ............. H01L 23/66 |
| 10,157,834 | B1 | 12/2018 | Tang et al. |
| 10,312,203 | B2 * | 6/2019 | Chiang ............. H01L 24/20 |
| 10,468,355 | B2 | 11/2019 | Wu et al. |
| 10,483,617 | B2 * | 11/2019 | Chuang ............. H01L 23/3107 |
| 10,510,693 | B2 | 12/2019 | Wu et al. |
| 10,629,539 | B2 | 4/2020 | Liang et al. |
| 10,636,753 | B2 | 4/2020 | Marimuthu et al. |
| 10,685,924 | B2 | 6/2020 | Lasiter et al. |
| 10,770,795 | B2 | 9/2020 | Wang et al. |
| 10,867,938 | B2 * | 12/2020 | Tang ............. H01L 24/19 |
| 10,868,353 | B2 | 12/2020 | Lu et al. |
| 11,024,954 | B2 | 6/2021 | Liu et al. |
| 11,043,730 | B2 | 6/2021 | Liu et al. |
| 11,355,849 | B2 * | 6/2022 | Yao ............. H01Q 1/523 |
| 2006/0092079 | A1 | 5/2006 | de Rochemont |
| 2007/0029667 | A1 | 2/2007 | Fujii et al. |
| 2014/0035097 | A1 | 2/2014 | Lin et al. |
| 2015/0340765 | A1 | 11/2015 | Dang et al. |
| 2016/0104940 | A1 | 4/2016 | Wang et al. |
| 2016/0218072 | A1 | 7/2016 | Liao et al. |
| 2016/0329299 | A1 | 11/2016 | Lin et al. |
| 2017/0033468 | A1 | 2/2017 | Wong |
| 2017/0140266 | A1 | 5/2017 | Wang et al. |
| 2017/0345761 | A1 | 11/2017 | Yu et al. |
| 2017/0346185 | A1 | 11/2017 | Wang et al. |
| 2018/0025999 | A1 | 1/2018 | Yu et al. |
| 2018/0034134 | A1 | 2/2018 | Dalmia |
| 2018/0166405 | A1 | 6/2018 | Chiang et al. |
| 2018/0247905 | A1 | 8/2018 | Yu et al. |
| 2018/0331041 | A1 | 11/2018 | Liao et al. |
| 2019/0027449 | A1 | 1/2019 | Wan et al. |
| 2019/0035737 | A1 | 1/2019 | Wu et al. |
| 2019/0069829 | A1 | 3/2019 | Bulut |
| 2019/0096828 | A1 | 3/2019 | Wu et al. |
| 2019/0096829 | A1 | 3/2019 | Tang et al. |
| 2019/0103652 | A1 | 4/2019 | Chuang et al. |
| 2019/0139897 | A1 | 5/2019 | Liang et al. |
| 2019/0181096 | A1 | 6/2019 | Wu et al. |
| 2019/0181104 | A1 | 6/2019 | Chen et al. |
| 2019/0252762 | A1 * | 8/2019 | Hsiao ............. H01Q 1/243 |
| 2019/0279951 | A1 * | 9/2019 | Chiang ............. H01L 24/92 |
| 2019/0348747 | A1 | 11/2019 | Liu et al. |
| 2019/0348748 | A1 | 11/2019 | Liu et al. |
| 2019/0348756 | A1 | 11/2019 | Liu et al. |
| 2020/0220250 | A1 | 7/2020 | Chih et al. |
| 2020/0258799 | A1 | 8/2020 | Chiang et al. |
| 2022/0059450 | A1 * | 2/2022 | Tang ............. H01Q 9/0414 |

FOREIGN PATENT DOCUMENTS

| | | | | |
|---|---|---|---|---|
| CN | 102753640 | A | 10/2012 | |
| CN | 106711131 | A | 5/2017 | |
| CN | 107792828 | A | 3/2018 | |
| CN | 109585387 | A | 4/2019 | |
| EP | 3091571 | A2 | 11/2016 | |
| EP | 3413347 | A1 | 12/2018 | |
| EP | 3486943 | A1 * | 5/2019 | ......... H01L 21/4846 |
| TW | 201906233 | A | 2/2019 | |
| WO | WO 2015/088486 | | 6/2015 | |
| WO | WO 2018/004684 | A1 | 1/2018 | |

OTHER PUBLICATIONS

Extended European Search Report dated Oct. 30, 2019 in connection with European Application No. 19173166.0.
Extended European Search Report dated Nov. 5, 2019 in connection with European Application No. 19173432.6.
U.S. Appl. No. 16/387,306, filed Apr. 17, 2019, Liu et al.
U.S. Appl. No. 16/387,354, filed Apr. 17, 2019, Liu et al.
U.S. Appl. No. 16/399,659, filed Apr. 30, 2019, Liu et al.
EP19173046.4, Oct. 21, 2019, Extended European Search Report.
EP19173166.0, Oct. 30, 2019, Extended European Search Report.
EP19173432.6, Nov. 5, 2019, Extended European Search Report.

\* cited by examiner

FAN-OUT PACKAGE STRUCTURE WITH INTEGRATED ANTENNA

CROSS REFERENCE TO RELATED APPLICATIONS

This Application is a Division of U.S. application Ser. No. 16/387,354, filed Apr. 17, 2019, entitled "FAN-OUT PACKAGE STRUCTURE WITH INTEGRATED ANTENNA", which claims the benefit of U.S. Provisional Application No. 62/670,920, filed on May 14, 2018, entitled "PROTECTING LAYER FOR ANTENNA FAN OUT PACKAGE," the entirety of which is incorporated by reference herein.

BACKGROUND OF THE INVENTION

Field of the Invention

The present invention relates to a semiconductor package structure, and in particular to a fan-out package structure that includes a protected antenna.

Description of the Related Art

In order to ensure the continued miniaturization and multi-functionality of electronic products and communication devices, semiconductor packages must be small in size, support multi-pin connection, operate at high speeds, and have high functionality. Additionally, in a high-frequency application such as a radio frequency (RF) system-in-package (SiP) assembly, antennas are typically used for enabling wireless communication.

When wireless communication packages with antennas are constructed, package designs need to provide good antenna properties (such as high efficiency, wide bandwidth, etc) while providing reliable and low cost package solutions. In such a conventional SiP structure, a discrete antenna component is individually encapsulated or mounted on a printed circuit board (PCB) or package. Since the PCB is required to provide additional area for the antenna component mounted thereon, it is difficult to reduce the device size. Additionally, the antenna mounted on the package may induce antenna oxidation, delamination between the antenna and the underlying package, and/or surface damage during testing. As a result, reliability, yield, and throughput of the semiconductor package structure are reduced.

Thus, a novel semiconductor package structure is desirable.

BRIEF SUMMARY OF THE INVENTION

Semiconductor package structures are provided. An exemplary embodiment of a semiconductor package structure includes a semiconductor die and a first molding compound layer surrounding the semiconductor die. The semiconductor package structure further includes a first redistribution layer (RDL) structure formed on a non-active surface of the semiconductor die and the first molding compound layer, a second molding compound layer formed on first RDL structure, and an insulating capping layer covering the second molding compound layer. The semiconductor package structure further includes a first antenna electrically coupled to the semiconductor die. The first antenna includes a first antenna element formed in the first RDL structure and a second antenna element formed between the second molding compound layer and the insulating capping layer.

Another exemplary embodiment of a semiconductor package structure includes a semiconductor die and a first molding compound layer surrounding the semiconductor die. The semiconductor package structure further includes a second molding compound layer formed above a first side of the semiconductor die and the first molding compound layer, a through via structure formed in the first molding compound layer, and an insulating capping layer covering the second molding compound layer. The semiconductor package structure further includes a patch antenna and a dipole antenna. The patch antenna includes a first antenna element formed between the first molding compound layer and the second molding compound layer and electrically coupled to the semiconductor die by the through via structure, and a second antenna element having a top surface and sidewall surfaces covered by the insulating capping layer. The dipole antenna is formed in the first molding compound layer.

Yet another exemplary embodiment of a semiconductor package structure includes a semiconductor die and a first molding compound layer surrounding the semiconductor die. The semiconductor package structure further includes a second molding compound layer formed above the semiconductor die and the first molding compound layer, a through via structure formed in the first molding compound layer, and an insulating capping layer covering the second molding compound layer. The semiconductor package structure further includes a patch antenna and a dipole antenna. The patch antenna includes a first antenna element formed between the first molding compound layer and the second molding compound layer and electrically coupled to the semiconductor die via the through via structure, and a second antenna element formed on a bottom surface of the insulating capping layer and separated from the first antenna element by the second molding compound layer. The dipole antenna formed in the first molding compound layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
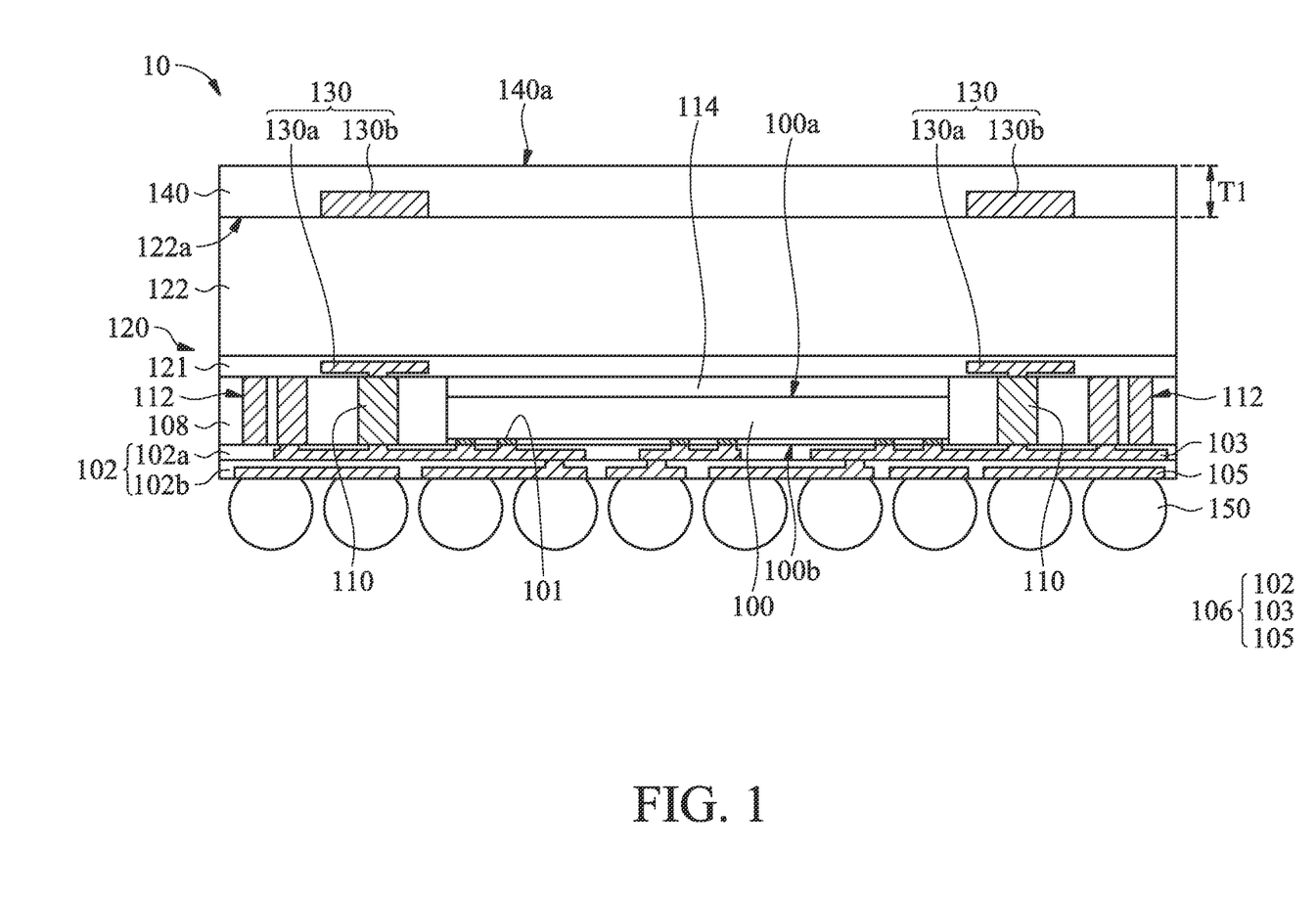
FIG. 1 is a cross-sectional view of an exemplary semiconductor package structure in accordance with some embodiments.

FIG. 1 is a cross-sectional view of an exemplary semiconductor package structure in accordance with some embodiments. In some embodiments, the semiconductor package structure 10 is a wafer-level semiconductor package structure, and is a flip-chip semiconductor package structure. As shown in FIG. 1, the semiconductor package structure is mounted on a base (not shown), in accordance with some embodiments. For example, the semiconductor package structure may be a system-on-chip (SOC) package structure. Moreover, the base may include a printed circuit board (PCB) and may be formed of polypropylene (PP). Alternatively, the base is a package substrate. The semiconductor package structure 10 is mounted onto the base by a bonding process. For example, the semiconductor package structure 10 includes conductive structures 150 that is mounted on and electrically coupled to the base by the bonding process. In some embodiments, each of the conductive structures 150 includes a conductive bump structure such as a copper bump or a solder bump structure, as shown in FIG. 1. Alternatively, each of the conductive structures 150 includes a conductive pillar structure, a conductive wire structure, or a conductive paste structure.

In some embodiments, the semiconductor package structure 10 further includes a semiconductor die 100, such as a system-on-chip (SOC) die. For example, the SOC die may includes a microcontroller (MCU), a microprocessor (MPU), a power management integrated circuit (PMIC), a global positioning system (GPS) device, or a radio frequency (RF) device or any combination thereof.

In some embodiments, the semiconductor die 100 has two opposing sides. More specifically, the semiconductor die 100 has a non-active surface 100a (which is also referred to as a rear surface) and an active surface 100b (which is also referred to as a front surface) opposite the non-active surface 100a. Pads 101 of the semiconductor die 100 are disposed on the active surface 100b and electrically connected to the circuitry (not shown) of the semiconductor die 100. In some embodiments, the pads 101 of the semiconductor die 100 belong to the uppermost metal layer of the interconnection structure (not shown) of the semiconductor die 100. It should be noted that the number of semiconductor dies integrated in the semiconductor package structure 10 is not limited to that disclosed in the embodiment.

In some embodiments, the semiconductor package structure 10 further includes a molding compound layer 108 surrounds the semiconductor die 100. In some embodiments, the molding compound layer 108 may be formed of an epoxy, a resin, a moldable polymer, or the like. The molding compound layer 108 may be applied while substantially liquid, and then may be cured through a chemical reaction, such as in an epoxy or resin. In some other embodiments, the molding compound layer 108 may be an ultraviolet (UV) or thermally cured polymer applied as a gel or malleable solid capable of being disposed around the semiconductor die 100, and then may be cured through a UV or thermal curing process. The molding compound layer 108 may be cured with a mold (not shown).

In some embodiments, the semiconductor package structure 10 further includes a redistribution layer (RDL) structure 106 formed below the semiconductor die 100 and the molding compound layer 108. The RDL structure 106, which is also referred to as a fan-out structure. The RDL structure 106 is disposed on the active surface 100b of the semiconductor die 100 and electrically connected thereto through the pads 101. Moreover, the conductive structures 150 are mounted on and electrically coupled to the RDL structure 106, such that the conductive structures 150 are separated from the molding compound layer 108 and the semiconductor die 100 through the RDL structure 106. In other words, the conductive structures 150 are free from contact with the molding compound layer 108 and the semiconductor die 100.

In some embodiments, the RDL structure 106 includes one or more conductive traces disposed in an inter-metal dielectric (IMD) layer 102. Conductive traces 103 are disposed at a first layer-level of the IMD layer 102 and at least one of the conductive traces 103 is electrically coupled to the semiconductor die 100. Moreover, conductive traces 105 are disposed at a second layer-level that is different from the first layer-level of the IMD layer 102. Moreover, at least one of the conductive traces 105 is electrically coupled to one or more conductive structures 150, so that the conductive structures 150 are electrically coupled to the semiconductor die 100 via the RDL structure 106.

In some embodiments, the IMD layer 102 includes a first sub-dielectric layer 102a and a second sub-dielectric layer 102b successively stacked from the active surface 100b of the semiconductor die 100, such that the conductive traces 103 are formed in the first sub-dielectric layer 102a, and the conductive traces 105 are formed in the second sub-dielectric layer 102b. It should be noted that the number of conductive traces and the number of sub-dielectric layers of the RDL structure 106 shown in FIG. 1 are only an example and are not a limitation to the present invention.

In some embodiments, the IMD layer 102 is formed of an organic material, which includes a polymer base material, a non-organic material, which includes silicon nitride ($SiN_x$), silicon oxide ($SiO_x$), graphene, or the like. For example, the first sub-dielectric layers 102a and the second sub-dielectric layer 102b are made of a polymer base material. In some other embodiments, the IMD layer 102 is a high-k dielectric layer (k is the dielectric constant of the dielectric layer). In some other embodiments, the IMD layer 102 may be formed of a photo sensitive material, which includes a dry film photoresist, or a taping film.

In some embodiments, the semiconductor package structure 10 further includes one or more through via structures 110 formed in and passing through the molding compound layer 108. The through via structures 110 are electrically coupled to the conductive traces 103 of the RDL structure 106. The through via structures 110 may be referred to as through insulator vias (TIVs) and be formed of copper.

In some embodiments, the semiconductor package structure 10 further includes an RDL structure 120 formed above the semiconductor die 100 and the molding compound layer 108. The RDL structure 120 may have a structure similar to the RDL structure 106 and is also referred to as a fan-out structure. In some embodiments, the non-active surface 100a of the semiconductor die 100 is adhered to the RDL structure 120 via an adhesion layer 114, such that the semiconductor die 100 and the molding compound layer 108 are interposed between the RDL structure 106 and the RDL structure 120.

In some embodiments, the RDL structure 120 is disposed on the molding compound layer 108 and the semiconductor die 100 and includes an IMD layer 121 and conductive traces (not shown) in the IMD layer 121. The IMD layer 121 may be a single layer or a multi-layer structure. The method and material used for forming the IMD layer 121 may be the same as or similar to those of the IMD layer 102. Similarly, the method and material used for forming the conductive traces of the RDL structure 120 may be the same as or similar to those of the conductive traces 103 and 105 of the RDL structure 106. In other words, the process for forming the RDL structure 106 can be used for forming the RDL structure 120.

In some embodiments, the semiconductor package structure 10 further includes a molding compound layer 122 formed on the RDL structure 120 above the non-active surface 100a of the semiconductor die 100 and the molding compound layer 108. Therefore, the RDL structure 120 separates the semiconductor die 100 from the molding compound layer 122. In some embodiments, the method and material used for forming the molding compound layer 122 may be the same as or similar to those of the molding compound layer 108.

In some embodiments, the semiconductor package structure 10 further includes one or more antennas 112 and one or more antennas 130 therein and electrically coupled to the semiconductor die 100. More specifically, in some embodiments, the antenna 112 is formed in the molding compound layer 108, and the through via structure 110 in the molding compound layer 108 is disposed between the semiconductor die 100 and the antenna 112. The antenna 112 is electrically coupled to the semiconductor die 100 via at least one of the conductive traces 103 of the RDL structure 106. In some embodiments, the antenna 112 is a dipole antenna. In some embodiments, the methods and materials used for forming the antenna 112 may be the same as or similar to those of the through via structure 110.

In some embodiments, unlike the antenna 112, the antenna 130 includes a first antenna element 130a and a second antenna element 130b that is separated from the first antenna element 130a. More specifically, in some embodiments, the first antenna element 130a is embedded in the IMD layer 121 of the RDL structure 120, so that the first antenna element 130a is formed between the molding compound layer 108 and the molding compound layer 122. The second antenna element 130b is formed on and in direct contact with the molding compound layer 122, so that the first antenna element 130a is separated from the second antenna element 130b by the molding compound layer 122. In some embodiments, the through via structure 110 formed in the molding compound layer 108 is electrically coupled between the first antenna element 130a and at least one of the conductive traces 103 of the RDL structure 106, so that the semiconductor die 100 is electrically coupled to the antenna 130. In some embodiments, the antenna 130 is a patch antenna using the molding compound layer 122 as a resonator. Therefore, the thickness of the molding compound layer 122 depends on the desired dielectric constant ($D_k$) and the desired dissipation factor ($D_f$, which is also referred to as loss tangent) for the antenna 130. In some embodiments, the first antenna element 130a is formed of at least one of the conductive traces in the RDL structure 120. In those cases, the methods and materials used for forming the first antenna element 130a may be the same as or similar to those of the conductive traces 103 and 105 in the IMD layer 102 of the RDL structure 106.

In some embodiments, the semiconductor package structure 10 further includes an insulating capping layer 140 covering and in direct contact with the top surface 122a of the molding compound layer 122 and the top surface and the sidewall surfaces of the second antenna element 130b, so that the second antenna element 130b is formed between the molding compound layer 122 and the insulating capping layer 140.

In some embodiments, the insulating capping layer 140 serves as a protection layer for preventing the second antenna element 130b of the antenna 130 from being oxidized or damaged. The insulating capping layer 140 has a substantially flat top surface 140a and has a thickness T1 measured from the top surface 122a of the molding compound layer 122 to the top surface 140a. In some embodiments, the thickness T1 is in a range from about 10 µm to about 100 µm. In some embodiments, the insulating capping layer 140 is made of polyimide, silicon nitride, silicon oxynitride, Ajinomoto™ Build-up Film (ABF), or other suitable organic materials. In some embodiments, the insulating capping layer 140 is formed by a lamination process.

Figure 2:
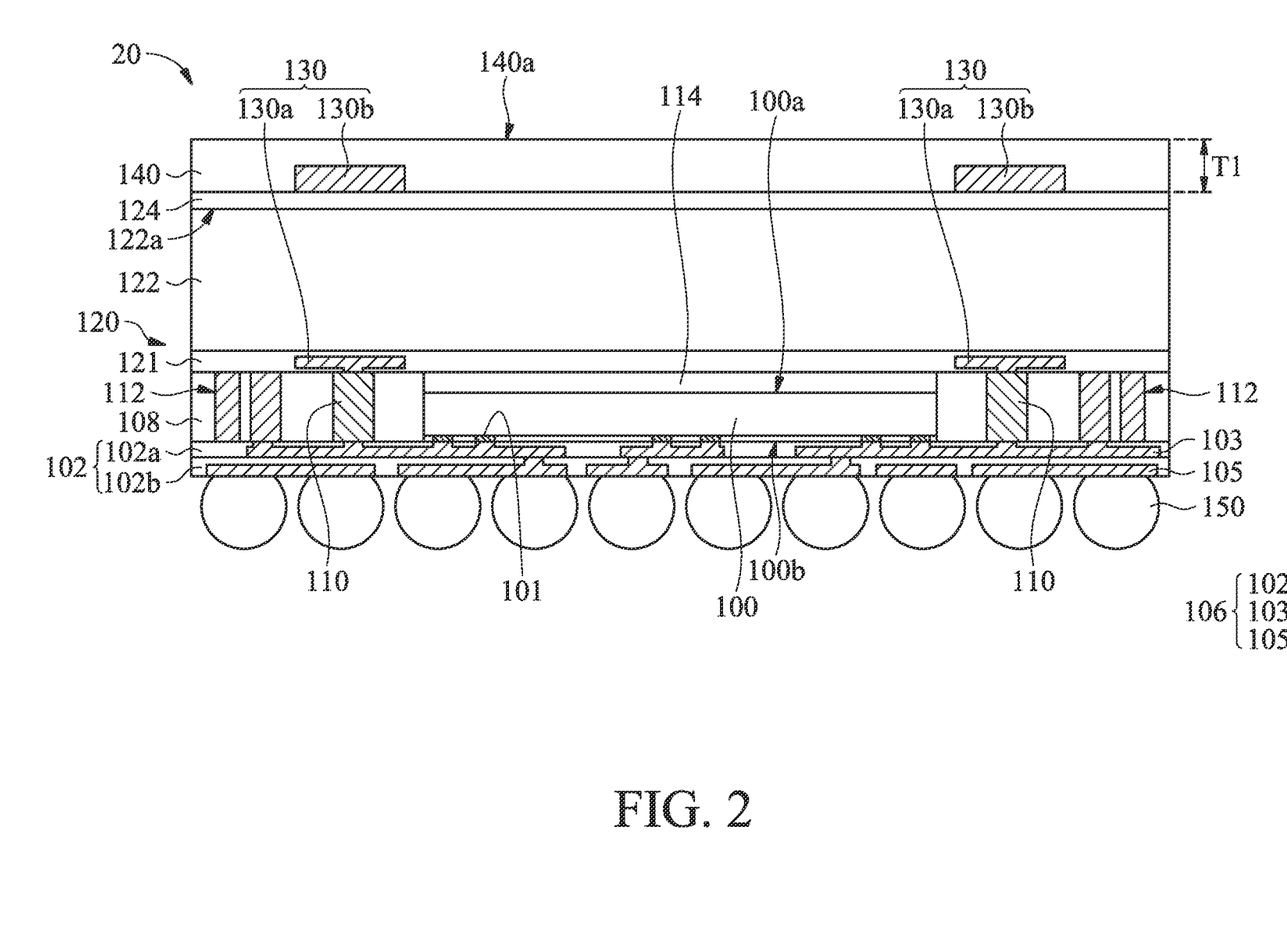
FIG. 2 is a cross-sectional view of an exemplary semiconductor package structure in accordance with some embodiments.

FIG. 2 is a cross-sectional view of an exemplary semiconductor package structure in accordance with some embodiments of the disclosure. Descriptions of elements of the embodiments hereinafter that are the same as or similar to those previously described with reference to FIG. 1 may be omitted for brevity. In the embodiment, the semiconductor package structure 20 is similar to the semiconductor package structure 10 shown in FIG. 1, except that the semiconductor package structure 20 further includes an adhesion layer 124 formed between the molding compound layer 122 and the insulating capping layer 140. The adhesion layer 124 between the molding compound layer 122 and the second antenna element 130b of the antenna 130 can improve the adhesion therebetween.

In some embodiments, the adhesion layer 124 is formed of a material selected from polyimide, silicon nitride, silicon oxynitride, or ABF. In some embodiments, the adhesion layer 124 is formed of a material that is different from that of the insulating capping layer 140.

Figure 3:
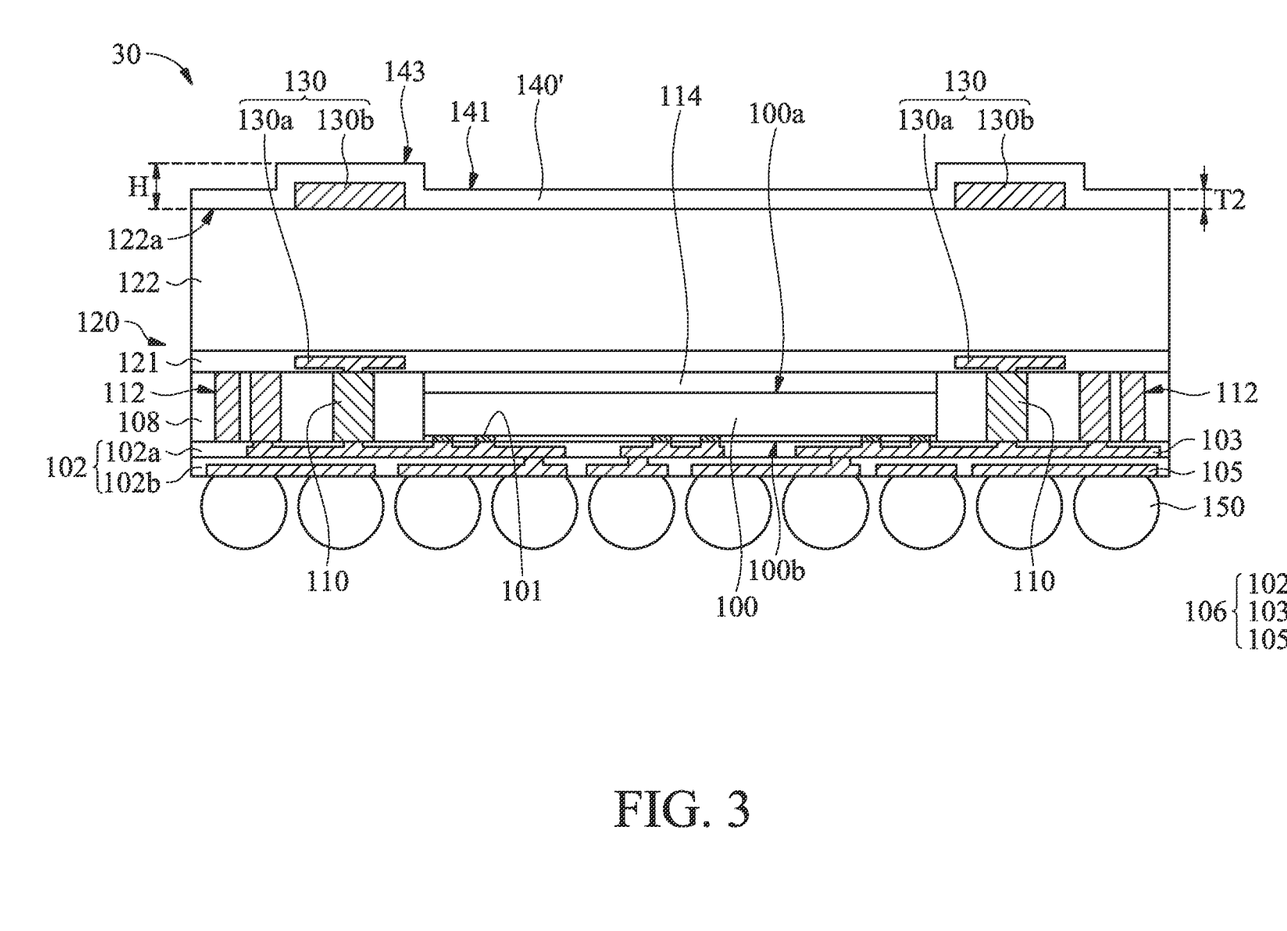
FIG. 3 is a cross-sectional view of an exemplary semiconductor package structure in accordance with some embodiments.

FIG. 3 is a cross-sectional view of an exemplary semiconductor package structure in accordance with some embodiments of the disclosure. Descriptions of elements of the embodiments hereinafter that are the same as or similar to those previously described with reference to FIG. 1 may be omitted for brevity. In the embodiment, the semiconductor package structure 30 is similar to the semiconductor package structure 10 shown in FIG. 1. Unlike the insulating capping layer 140 in the semiconductor package structure 10, the insulating capping layer 140' in the semiconductor package structure 30 has a substantially uniform thickness T2, and the top surface and sidewall surfaces of the second antenna element 130b of the antenna 130 is conformally covered by the insulating capping layer 140'.

In some embodiments, the insulating capping layer 140' has a thickness measured from the top surface 122a of the molding compound layer 122 to the top surface 141 of a portion of the insulating capping layer 140' that is in direct to the molding compound layer 122. In some embodiments, such a thickness may be substantially equal to the thickness T2. In some embodiments, the insulating capping layer 140' has a height H measured from the top surface 122a of the molding compound layer 122 to the top surface 143 of a portion of the insulating capping layer 140' above the second antenna element 130b of the antenna 130. In some embodiments, the height H is in a range from about 10 μm to about 100 μm. In some embodiments, the insulating capping layer 140' is formed by a deposition process (such as chemical vapor deposition (CVD)) or a coating process.

Figure 4:
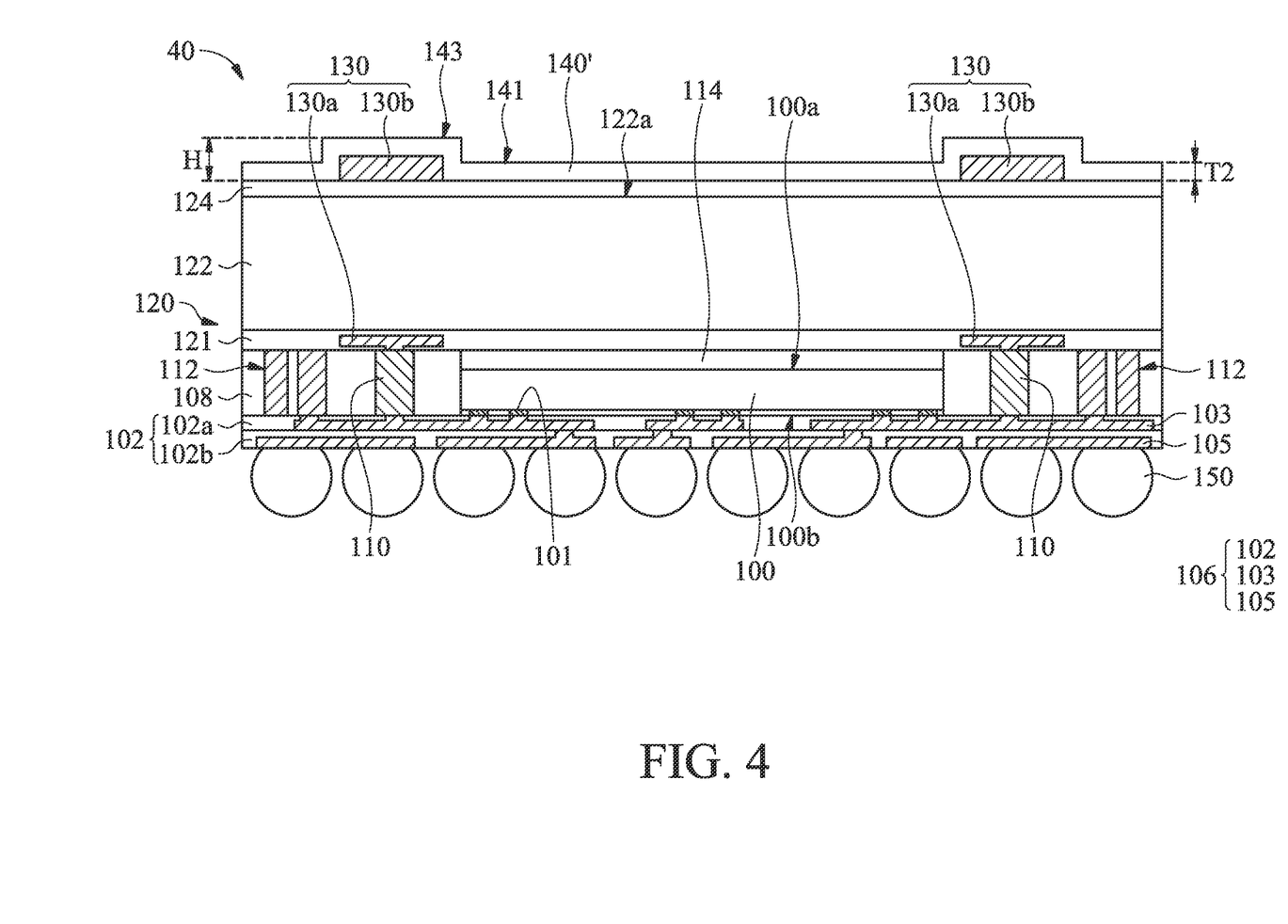
FIG. 4 is a cross-sectional view of an exemplary semiconductor package structure in accordance with some embodiments.

FIG. 4 is a cross-sectional view of an exemplary semiconductor package structure in accordance with some embodiments of the disclosure. Descriptions of elements of the embodiments hereinafter that are the same as or similar to those previously described with reference to FIGS. 1, 2 and 3 and may be omitted for brevity. In the embodiment, the semiconductor package structure 40 is similar to the semiconductor package structure 30 shown in FIG. 3, except that the semiconductor package of the semiconductor package structure 40 further includes an adhesion layer 124 formed between the molding compound layer 122 and the insulating capping layer 140. The adhesion layer 124 between the molding compound layer 122 and the second antenna element 130b of the antenna 130 can improve the adhesion therebetween.

Figure 5:
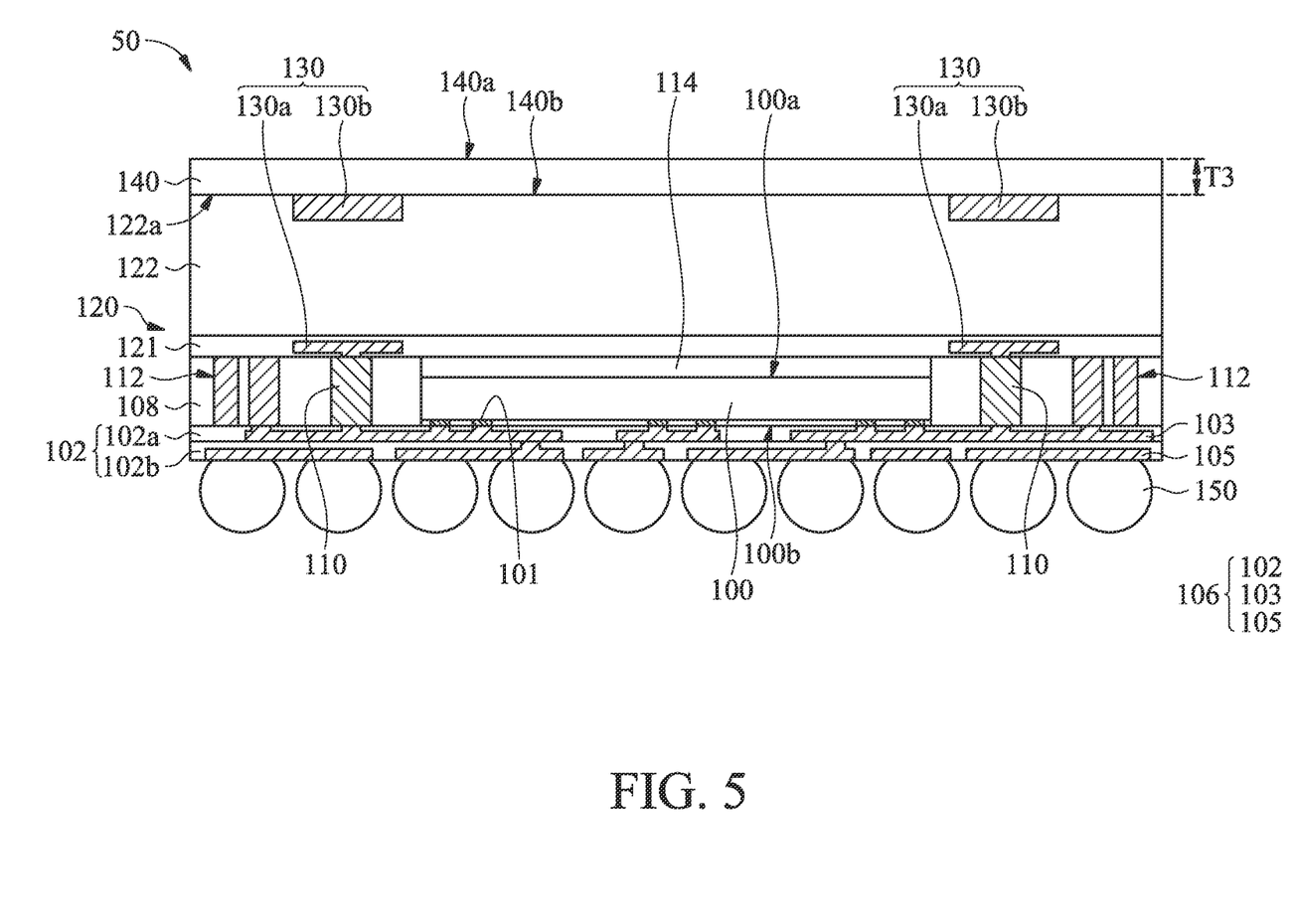
FIG. 5 is a cross-sectional view of an exemplary semiconductor package structure in accordance with some embodiments.

FIG. 5 is a cross-sectional view of an exemplary semiconductor package structure 50 in accordance with some embodiments of the disclosure. Descriptions of elements of the embodiments hereinafter that are the same as or similar to those previously described with reference to FIG. 1 may be omitted for brevity. In the embodiment, the semiconductor package structure 50 is similar to the semiconductor package structure 10 shown in FIG. 1. Unlike the semiconductor package structure 10, the second antenna element 130b of the antenna 130 in the semiconductor package structure 50 is formed in the molding compound layer 122. More specifically, the second antenna element 130b is formed on the bottom surface 140b of the insulating capping layer 140 with a uniform thickness T3 that may be substantially equal to the thickness T1 shown in FIG. 1.

Moreover, the molding compound layer 122 extends on sidewalls of the second antenna element 130b, so that the second antenna element 130b of the antenna 130 is surrounded by the molding compound layer 122 and separated from the first antenna element 130a of the antenna 130 by the molding compound layer 122. In this case, the bottom surface and sidewall surfaces of the second antenna element 130b are covered by the molding compound layer 122, and the top surface of the molding compound layer 122 is substantially level with the top surface of the second antenna element 130b of the antenna 130.

Figure 6:
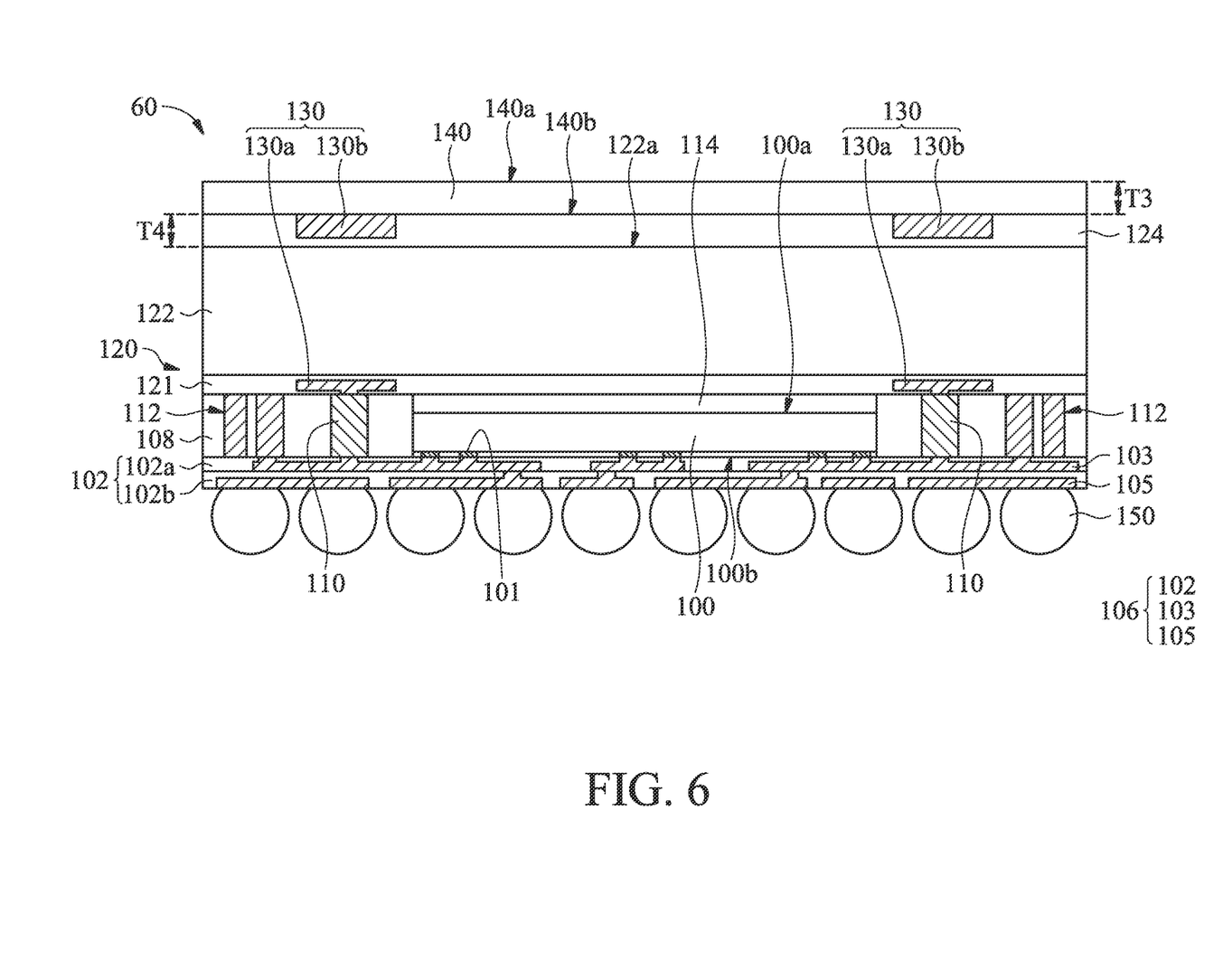
FIG. 6 is a cross-sectional view of an exemplary semiconductor package structure in accordance with some embodiments.

FIG. 6 is a cross-sectional view of an exemplary semiconductor package structure 60 in accordance with some embodiments of the disclosure. Descriptions of elements of the embodiments hereinafter that are the same as or similar to those previously described with reference to FIGS. 1, 2 and 5 may be omitted for brevity. In the embodiment, the semiconductor package structure 60 is similar to the semiconductor package structure 50 shown in FIG. 5. Unlike the semiconductor package structure 50, the semiconductor package structure 20 further includes an adhesion layer 124 formed between the molding compound layer 122 and the insulating capping layer 140. Moreover, the second antenna element 130b of the antenna 130 in the semiconductor package structure 60 is formed in the adhesion layer 124.

More specifically, the second antenna element 130b is formed on the bottom surface 140b of the insulating capping layer 140. Moreover, the adhesion layer 124 extends on sidewalls of the second antenna element 130b, so that the second antenna element 130b of the antenna 130 is surrounded by the adhesion layer 124. In this case, the bottom surface and sidewall surfaces of the second antenna element 130b are covered by the adhesion layer 124, and the top surface of the second antenna element 130b is substantially level with the top surface of the adhesion layer 124.

In some embodiments, the insulating capping layer 140 has a uniform thickness T3 that may be substantially equal to the thickness T1 shown in FIG. 1. In some embodiments, the adhesion layer 124 has a thickness T4 measured from the top surface 122a of the molding compound layer 122 to the top surface of the adhesion layer 124. In some embodiments, the thickness T4 is in a range from about 10 μm to about 100 μm.

According to the foregoing embodiments, the semiconductor package structure is designed to fabricate an insulating capping/protection layer and antennas integrated into the semiconductor package structure. The insulating capping/protection layer prevents the antenna element on the molding compounding layer from being oxidized, delaminated from the underlying molding compounding layer, and/or damaged during testing. As a result, reliability, yield, and throughput of the semiconductor package structure can be improved. As a result, reliability, yield, and throughput of the semiconductor package structure are increased and the manufacturing cost of the semiconductor package structure is reduced. Additionally, the integrated capping/protection layer can provide design flexibility for selecting a material of the patch antenna that is integrated in the semiconductor package structure, so as to minimize the antenna loss.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor package structure, comprising:
a semiconductor die;
a first molding compound layer surrounding the semiconductor die;
a second molding compound layer formed above a first side of the semiconductor die and the first molding compound layer;
a through via structure formed in the first molding compound layer;
an insulating capping layer covering the second molding compound layer;
a patch antenna, comprising:
a first antenna element formed between the first molding compound layer and the second molding compound layer and electrically coupled to the semiconductor die by the through via structure; and
a second antenna element having a top surface and sidewall surfaces covered by the insulating capping layer;
a dipole antenna formed in the first molding compound layer; and
an adhesion layer between the second molding compound layer and the second antenna element,
wherein a bottom surface and sidewall surfaces of the second antenna element are covered by the adhesion layer, and wherein a top surface of the second antenna element is substantially level with a top surface of the adhesion layer.
2. The semiconductor package structure as claimed in claim 1, further comprising a redistribution layer (RDL)

structure separating the semiconductor die from the second molding compound layer, wherein the first antenna element is in the RDL structure.

3. The semiconductor package structure as claimed in claim 1, further comprising:
   an RDL structure formed on a second side of the semiconductor die opposite the first side; and
   a plurality of conductive structures electrically coupled to the semiconductor die via the RDL structure,
   wherein the semiconductor die is electrically coupled to the through via structure by the RDL structure.

4. The semiconductor package structure as claimed in claim 1, wherein the insulating capping layer and the adhesion layer are formed of different materials.

5. The semiconductor package structure as claimed in claim 1, wherein the insulating capping layer has a substantially flat top surface.

\* \* \* \* \*